United States Patent [19]

Kim et al.

[11] Patent Number: 5,818,790
[45] Date of Patent: Oct. 6, 1998

[54] METHOD FOR DRIVING WORD LINES IN SEMICONDUCTOR MEMORY DEVICE

[75] Inventors: Jung Pill Kim; Kee Woo Park, both of Kyoungki-do, Rep. of Korea

[73] Assignee: Hyundai Electronics Industries Co., Ltd., Rep. of Korea

[21] Appl. No.: 777,224

[22] Filed: Dec. 27, 1996

[30] Foreign Application Priority Data

Dec. 29, 1995 [KR] Rep. of Korea ................. 1995-66002

[51] Int. Cl.⁶ .................................................. G11C 8/00
[52] U.S. Cl. .............................. 365/230.06; 365/189.09
[58] Field of Search ..................... 365/230.06, 189.09, 365/189.11, 149

[56] References Cited

U.S. PATENT DOCUMENTS 5,373,479 12/1994 Noda ................................. 365/230.06
5,416,747 5/1995 Ohira ................................. 365/230.06
5,467,032 11/1995 Lee ................................. 365/230.06 X

*Primary Examiner*—David C. Nelms
*Assistant Examiner*—Son Mai
*Attorney, Agent, or Firm*—Townsend and Townsend and Crew LLP

[57] ABSTRACT

A method for driving word lines in a semiconductor memory device. A main row decoder generates a word line enable signal in s response to one part of address signal bits and a sub row decoder generates a word line boosting signal in response to the other part of the address signal bits. A bootstrap transistor transfers the word line enable signal from the main row decoder to a bootstrap node in response to a specific voltage. A high level voltage transfer transistor transfers the word line boosting signal from the sub row decoder to a corresponding one of the word lines in response to a voltage at the bootstrap node. After the word line enable signal from the main row decoder makes a low to high transition in level, the word line boosting signal from the sub row decoder is changed from a ground voltage level to a high voltage level to drive the corresponding word line. Then, the specific voltage is changed from the present level to the lower level. According to the present invention, the word line driving method can prevent a selected word line from floating due to OFF current resulting from a low level voltage at the bootstrap node when a row address strobe signal has a long duration. Furthermore, the word line driving method has the effect of enhancing the bootstrapping efficiency.

19 Claims, 5 Drawing Sheets

METHOD FOR DRIVING WORD LINES IN SEMICONDUCTOR MEMORY DEVICE

BACKGROUND OF THE INVENTION

1. Field of the Invention

The present invention relates in general to driving word Lines in semiconductor memory devices, and more particularly to a method for driving word lines in a semiconductor memory device which is capable of preventing a selected word line from floating due to OFF current resulting from a low level voltage at a bootstrap node when a row address strobe signal has a long duration.

2. Description of the Prior Art

Generally, a semiconductor memory device such as a dynamic random access memory (referred to hereinafter as DRAM) comprises a cell array block for storing data therein. The cell array block includes word lines and bit lines interconnected in the form of a net, and a plurality of cells connected to the word lines and bit lines, each of which is provided with an NMOS transistor and a capacitor.

On the other hand, a row decoder is adapted to select a desired one of the word lines in the cell array block. Namely, the row decoder selects one of the word lines in the cell array block corresponding to an input row address. Such a conventional row decoder circuit will hereinafter be described with reference to FIG. 1A.

FIG. 1A is a circuit diagram illustrating the construction of a conventional row decoder circuit for driving word lines in a semiconductor memory device. As shown in this drawing, the conventional row decoder circuit comprises a main row decoder 11 and a plurality of sub row decoders 12.

The main row decoder 11 includes PMOS transistors MP1 and MP2 connected in parallel between a source of supply voltage Vcc and a node N1, and NMOS transistors MN1–MN3 connected in series between the node N1 and a source of ground voltage Vss. The PMOS transistor MP1 has its gate for inputting a control signal xap and the PMOS transistors MP2 has its gate connected to a node N2. The NMOS transistors MN1–MN3 have their gates for inputting row address bits ax23, ax45 and ax67, respectively. The main row decoder 11 further includes an inverter GI connected between the nodes N1 and N2, and an inverter G2 connected between the node N2 and a node N4.

Each of the sub row decoders 12 includes an NMOS transistor MN4 connected between the node N2, and a node N3, an NMOS transistor MN5 connected between an output terminal pxi of a high level voltage transfer decoder (not shown) and a node N5, and an NMOS transistor MN6 connected between the node N5 and the ground voltage source Vss. The NMOS transistor MN4 has its gate connected to the supply voltage source Vcc and the NMOS transistor MN5 has its gate connected to the node N3. The NMOS transistor MN6 has its gate connected to the node N4.

The operation of the conventional row decoder circuit with the above mentioned construction will hereinafter be described.

For example, assuming that n word lines are present in one cell array block, n main row decoders 11 are required to select one of the n word lines. In this case, because the main row decoders 11 are very large in occupying area, they are hard to use in a highly integrated semiconductor memory device.

Therefore, in order to solve such a problem, there has conventionally been proposed a method for connecting at least two sub row decoders 12 to one main row decoder 11 and decoding signals on input power lines pxi to the sub row decoders 12, as shown in FIG. 1A.

In FIG. 1A, four sub row decoders 12 are connected to one main row decoder 11 and a boosted high level voltage Vpp is transferred to only one of input power lines pxi to the sub row decoders 12. In this case, because four sub row decoders 12 are connected to each main row decoder 11 under the condition that n word lines are present in each cell array block, n/4 main row decoders 11 are required for each cell array block, resulting in a reduction in occupying area.

On the other hand, in the case where an NMOS transistor is used as a DRAM cell transistor, a word line enable Voltage higher than the supply voltage Vcc is used to transfer high level data well. The reason is that the NMOS transistor used as the DRAM cell transistor is limited in the voltage transfer capability due to a threshold voltage thereof.

In other words, in the case where a gate voltage to the NMOS transistor has the supply voltage level Vcc, a high level voltage transferable by the NMOS transistor is Vcc–Vtn (the threshold voltage of the NMOS transistor). For this reason, a voltage higher than the supply voltage Vcc must be applied to the gate of the NMOS transistor in order to compensate for a voltage drop due to the threshold voltage Vtn of the NMOS transistor.

In this case, however, there is required means for making a gate voltage to the high level voltage transfer transistor MN5 in the sub row decoder 12 higher than the high level voltage Vpp for the compensation for the transfer characteristic (Vcc–Vtn) of the NMOS transistor when the high level voltage Vpp is transferred to the corresponding word line. Such a means is the bootstrap transistor MN4 in the sub row decoder 12.

The operation of selecting a desired word line and transferring the high level voltage Vpp to the selected word line will now be discussed.

First, one of the main row decoders 11 associated with the desired word line is selected by the row address bits ax23, ax45 and ax67. In the selected main row decoder 11, the supply voltage Vcc is transferred to the output node N2, thereby causing a voltage (Vcc–Vtn) to be transferred to the bootstrap nodes N3 in the sub row decoders 12 connected to the selected main row decoder 11, when a gate voltage to the bootstrap transistor MN4 in each sub row decoder 12 has the supply voltage level Vcc where Vtn is a threshold voltage of the bootstrap transistor MN4.

Then, the word line enable voltage Vpp from the high level voltage transfer decoder is applied to a high level voltage transfer node pxi corresponding to the desired word line. For example, in the case where the word line enable voltage Vpp from the high level voltage transfer decoder is applied to the high level voltage transfer node px0, a voltage at the high level voltage transfer node px0 is changed from the ground voltage level Vss to the word line enable voltage level Vpp. As a result, the voltage (Vcc–Vtn) at the gate node N3 of the high level voltage transfer transistor MN5 is raised to the high voltage level Vpp or more because of a capacitance between the high level voltage transfer node px0 and the gate node N3 of the high level voltage transfer transistor MN5, thereby causing the word line enable voltage Vpp at the high level voltage transfer node px0 to be transferred to the desired word line WL0.

Noticeably, in the case where the main row decoder 11 is not selected, the voltage at the bootstrap node N3 has the ground voltage level Vss. As a result, the bootstrapping phenomenon does not occur because the high level voltage transfer transistor MN5 in the sub row decoder 12 produces a small capacitance. Further, when the high level voltage transfer node pxi has the ground voltage level Vss under the condition that the main row decoder 11 is selected, the corresponding word line is not enabled.

On the other hand, assuming the number of cells connected to word lines in one cell array block is 1k, the sub row decoders 12 must drive all the 1k cells. For this reason, a desired voltage may not be transferred to all of the 1k cells connected to the word lines. Further, a time delay may occur in the voltage transfer to the cells.

In order to solve the above problem with the construction in FIG. 1A, another row decoder circuit as shown in FIG. 1B has been proposed. As shown in this drawing, the cell array block is divided into n parts and one sub row decoder 12 is connected to each of the n cell array block parts to decode the corresponding word line. Each main row decoder 11 is positioned in the left or right of the associated circuitry. The sub row decoders 12 are increased in number by the divided cell array block parts, resulting in a reduction in the drive size thereof. However, as the sub row decoders 12 are reduced in the drive size, the bootstrapping efficiency at the bootstrap node N3 is degraded, resulting in the following problems.

First, the output signal pxi from the high level voltage transfer decoder which has the high voltage level Vpp higher than the voltage level of Vcc+Vtn (the threshold voltage of the cell NMOS transistor) cannot sufficiently be transferred due to the low level voltage at the bootstrap node N3. As a result, the transfer speed is delayed or the supply voltage Vcc is not fully transferred to the cell because of the lower high level voltage. This may cause a refresh problem.

Second, although the low level voltage at the bootstrap node N3 can sufficiently transfer the high voltage level Vpp and the delayed transfer speed is worth little consideration, the voltage at the bootstrap node N3 becomes lower in level due to OFF current and junction leakage current with the lapse of time. If the voltage level at the bootstrap node N3 becomes lower than the voltage level of Vpp+Vtn (the threshold voltage of the NMOS transistor MN5), the corresponding word line enters a floating state, resulting in an unexpected problem. Usually, in the DRAM, time of at least 100 μs must be assured for a row address strobe matrix construction.

A conventional word line driving method has recently been proposed to solve the above two problems. In the, conventional word line driving method, a voltage VXG higher than the supply voltage Vcc and lower than the voltage of Vcc+Vtn (the threshold voltage of the NMOS transistor MN4) is applied to the gate of the bootstrap transistor MN4 to enhance the bootstrapping efficiency at the bootstrap node N3. As a result, the voltage at the bootstrap node N3 which has the level of Vcc−Vtn (the threshold voltage of the NMOS transistor MN4) in the case where VXG=Vcc is raised to a level of VXG−Vtn (the threshold voltage of the NMOS transistor MN4). Therefore, a relatively high voltage can be assured at the bootstrap node N3.

For example, in the case where VXG=Vcc+0.5 V, a voltage of Vcc−Vtn (the threshold voltage of the NMOS transistor MN4)+0.5V is applied to the gate of the bootstrap transistor MN4. As a result, the output signal pxi from the high level voltage transfer decoder which has the high voltage level Vpp can be well transferred to the selected word line through the high level voltage transfer transistor MN5. However, the above-mentioned conventional word line driving method has a disadvantage in that the VXG generation device must accurately be designed. Furthermore, the VXG level is liable to vary with a process variation. In other words, if the voltage VXG has a low level approximated to the supply voltage Vcc, it is insignificant. In the case where the voltage VXG is higher than the voltage of Vcc+Vtn (the threshold voltage of the NMOS transistor MN4), the word line may float due to OFF current flowing from the bootstrap node N3 to the node N2 through the bootstrap transistor MN4, when a row address strobe signal has a long duration.

SUMMARY OF THE INVENTION

Therefore, the present invention has been made in view of the above problems, and it is an object of the present invention to provide a method for driving word lines in a semiconductor memory device, which is capable of preventing a selected word line from floating due to OFF current resulting from a low level voltage at a bootstrap node when a row address strobe signal has a long duration.

In accordance with an aspect of the present invention a method for driving word lines in a semiconductor memory device comprises the first step of allowing a main row decoder to generate a word line enable signal in response to one part of address signal bits; the second step of allowing a sub row decoder to generate a word line boosting signal in response to the other part of the address signal bits; the third step of allowing bootstrap means to transfer the word line enable signal from the main row decoder to a bootstrap node in response to a specific voltage; the fourth step of allowing high level voltage transfer means to transfer the word line boosting signal from the sub row decoder to a corresponding one of the word lines in response to a voltage at the bootstrap node; the fifth step of changing the word line boosting signal from the sub row decoder from a ground voltage level to a high voltage level after the word line enable signal from the main row decoder makes a low to high transition in level, to drive the corresponding word line; and the sixth step of changing the specific voltage from the present level to the lower level after performing the fifth step.

In accordance with another aspect of the present invention, a method for driving word lines in a semiconductor memory device comprises the first step of allowing a main row decoder to generate a word line enable signal in response to one part of address signal bits; the second step of allowing a sub row decoder to generates a word line boosting signal in response to the other part of the address signal bits; the third step of allowing bootstrap means to transfer the word line enable signal from the main row decoder to a bootstrap node in response to a specific voltage; the fourth step of allowing high level voltage transfer means to transfer the word line boosting signal from the sub row decoder to a corresponding one of the word lines in response to a voltage at the bootstrap node; the fifth step of raising the voltage at the bootstrap node to a desired level after the word line enable signal from the main row decoder makes a low to high transition in level and then allowing the specific voltage to make a high to low transition in level; and the sixth step of changing the word line boosting signal from the sub row decoder from a ground voltage level to a high voltage level after the specific voltage makes the high to low transition in level, to drive the corresponding word line.

In accordance with yet another aspect of the present invention, a method for driving word lines in a semiconductor memory device comprises the first step of allowing a main row decoder to generate a word line enable signal in response to one part of address signal bits; the second step of allowing a sub row decoder to generate a word line boosting signal in response to the other part of the address signal bits; the third step of allowing bootstrap means to transfer the word line enable signal from the main row decoder to a bootstrap node in response to a specific voltage; the fourth step of allowing high level voltage transfer means to transfer the word line boosting signal from the sub row decoder to a corresponding one of the word lines in response to a voltage at the bootstrap node; the fifth step of raising the voltage at the bootstrap node to a desired level when the word line enable signal from the main row decoder is changed from a ground voltage level to a supply voltage level and then allowing the specific voltage to make a high to low transition in level; and the sixth step of changing the word line boosting signal from the sub row decoder from the ground voltage level to a high voltage level when the voltage at the bootstrap node is raised to the desired level, to drive the corresponding word line.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1A:
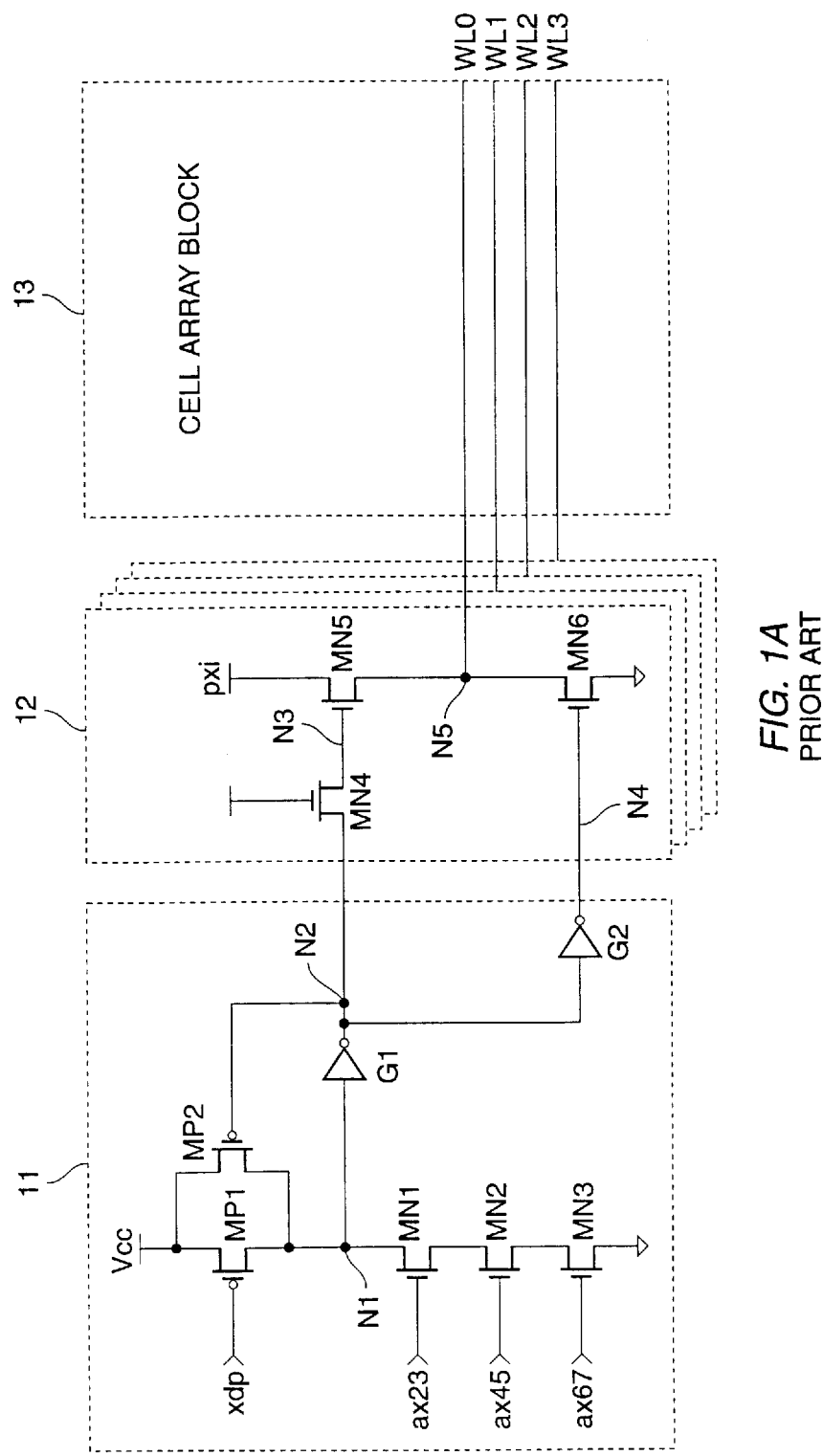
FIGS. 1A and 1B are circuit diagrams illustrating the constructions of conventional row decoder circuits for driving word lines in a semiconductor memory device.
Figure 1B:
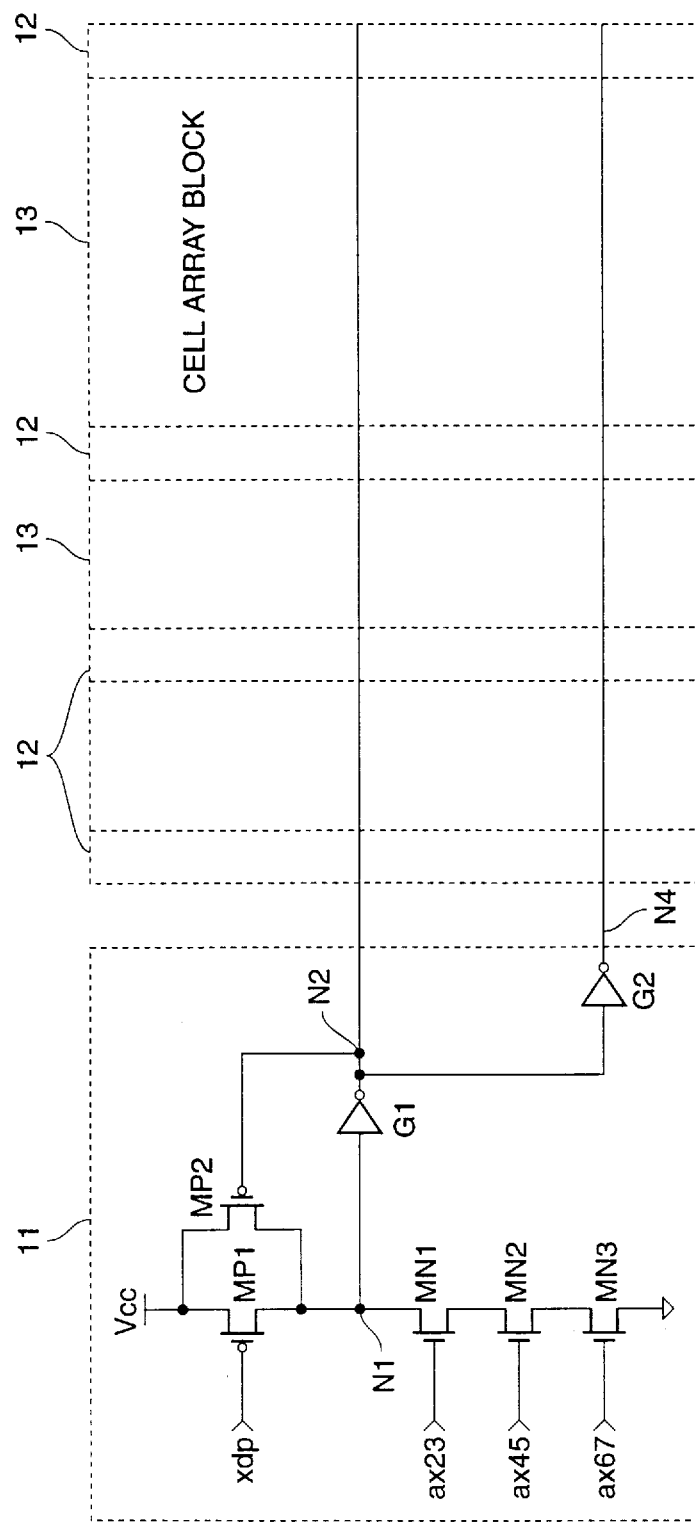
Figure 2:
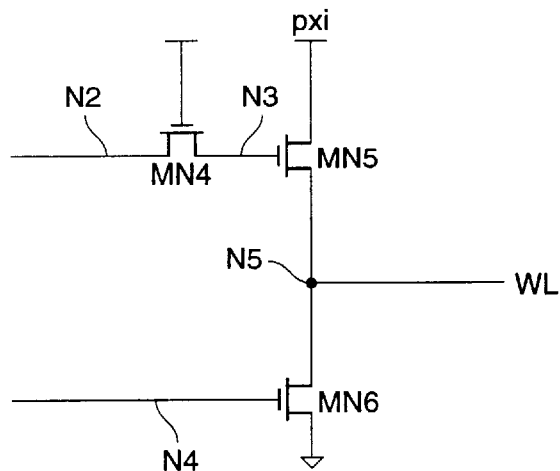
FIG. 2 is a circuit diagram illustrating the construction of a sub row decoder in a word line drive circuit which is applied to the present invention.

FIG. 2 is a circuit diagram illustrating the construction of a sub row decoder in a word line drive circuit which is applied to the present invention. The construction of the sub row decoder in FIG. 2 is the same as that of the conventional sub row decoder 12 in FIGS. 1A and 1B and a description thereof will thus be omitted.

Figure 3:
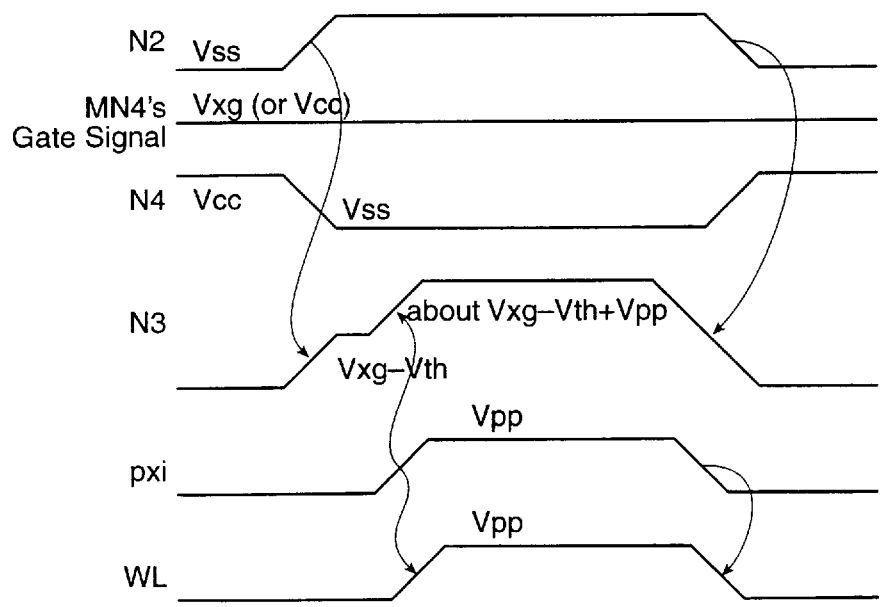
FIG. 3 is a timing diagram illustrating a method for driving word lines in a semiconductor memory device in accordance with a first embodiment of the present invention.

FIG. 3 is a timing diagram illustrating method for driving word lines in a semiconductor memory device in accordance with a first embodiment of the present invention. The word line driving method in accordance with the first embodiment of the present invention will hereinafter be described in detail with reference to FIGS. 2 and 3.

At the initial state, the signal at the node N2 has the ground voltage level Vss. In the case where the voltage VXG of Vcc+0.5 V is applied to the gate of the bootstrap transistor MN4, the signal at the node N4 has the supply voltage level Vcc and the signal at the bootstrap node N3 has the ground voltage level Vss. Also, the output signal pxi from the high level voltage transfer decoder has the ground voltage level Vss. As a result, the ground voltage Vss is transferred to the corresponding word line WL. Then, when the signal at the node N2 is changed from the ground voltage level Vss to the supply voltage level Vcc and the signal at the node N4 is changed from the supply voltage level Vcc to the ground voltage level Vss, the signal at the bootstrap node N3 has the voltage level of Vcc+0.5 V−Vtn (the threshold voltage of the NMOS transistor MN4). At this time, if the output signal pxi from the high level voltage transfer decoder, is changed from the ground voltage level Vcc to the high voltage level Vpp, the signal at the bootstrap node N3 has a voltage level Vcc+0.5 V −Vtn (the threshold voltage of the NMOS transistor MN4)+Vpp on the assumption that the efficiency is 100 %. As a result, the high level voltage Vpp is transferred to the corresponding word line WL through the high level voltage, transfer transistor MN5.

Alternatively, the bootstrap transistor MN4 maybe designed to have a threshold voltage lower than that of the general NMOS transistor. For example, in the case where the bootstrap transistor MN4 has a threshold voltage lower by 0.5 V than that of the general NMOS transistor, the signal at the bootstrap node N3 has a voltage level of Vcc−Vtn (the threshold voltage of the NMOS transistor MN4)−0.5 V when the signal at the node N2 is changed from the ground voltage level Vss to the supply voltage level Vcc.

Also, in order to prevent the word line from floating, the voltage level at the bootstrap node N3 must be higher than the voltage level of Vpp+Vtn (the threshold voltage of the NMOS transistor MN5) under the condition that a row address strobe signal RAS has a long duration. To this end, the high level voltage transfer transistor MN5 may be designed to have a threshold voltage lower than that of the general NMOS transistor. Alternatively, depletion NMOS transistor may be used as the high level voltage transfer transistor MN5. As a result, the floating condition of the word line is lowered in such a manner that the word line cannot float for a longer time.

Figure 4:
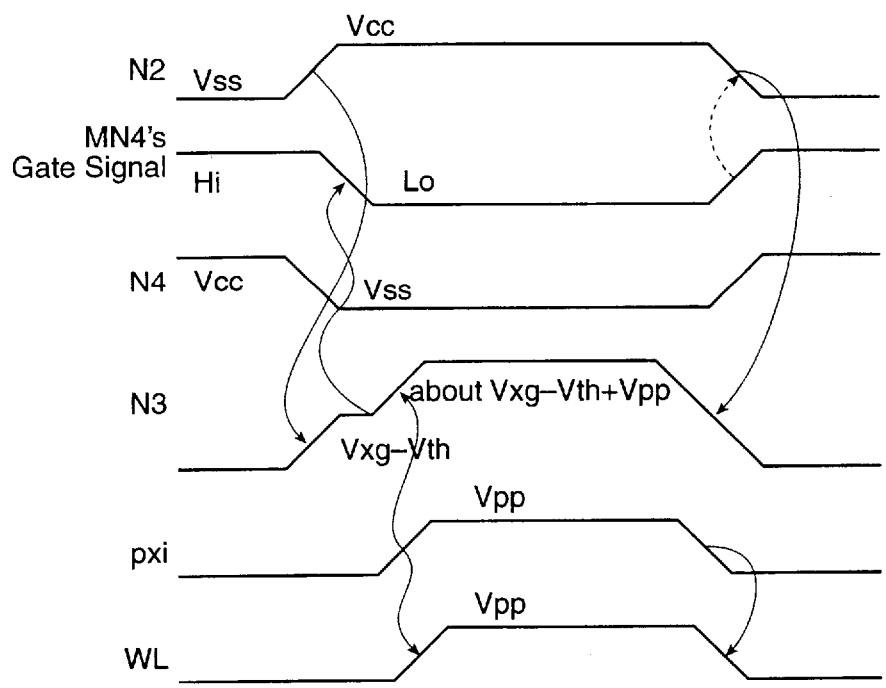
FIG. 4 is a timing diagram illustrating a method for driving word lines in a semiconductor memory device in accordance with a second embodiment of the present invention.

FIG. 4 is a timing diagram illustrating a method for driving word lines in a semiconductor memory device in accordance with a second embodiment of the present invention. The word line driving method in accordance with the second embodiment of the present invention will hereinafter be described in detail with reference to FIGS. 2 and 4.

At the initial state, the signal at the node N2 has the ground voltage level Vss, the supply voltage Vcc is applied to the gate of the bootstrap transistor MN4 and the output signal pxi from the high level voltage transfer decoder has the ground voltage level Vss. As the supply voltage Vcc is applied to the gate of the bootstrap transistor MN4, the signal at the bootstrap node N3 has the ground voltage level Vss. Then when the signal at the node N2 is changed from the ground voltage level Vss to the supply voltage level Vcc, the signal at the bootstrap node N3 is changed from the ground voltage level Vss to the voltage level of Vcc−Vtn (the threshold voltage of the NMOS transistor MN4). At this time, if the gate voltage to the bootstrap transistor MN4 is changed from the supply voltage level Vcc to the ground voltage level Vss and the output signal pxi from the high level voltage transfer decoder is changed from the ground voltage level Vss to the high voltage level Vpp, the high level voltage Vpp is transferred to the corresponding word line WL through the high level voltage transfer transistor MN5. Also, a gate source voltage Vgs of the bootstrap transistor MN4 has a level of −Vcc as the gate voltage to the bootstrap transistor MN4 is changed from the supply voltage level Vcc to the ground voltage level Vss, thereby causing the bootsrap transistor MN4 to be turned off. As a result, the amount of OFF current flowing from the bootstrap node N3 to the node N2 can be reduced. In this second embodiment, the high level voltage transfer transistor MN5 needs not have a threshold voltage lower than that of the general NMOS transistor. Also, the second embodiment can solve the word line floating problem resulting from the OFF current flowing from the bootstrap node N3 to the node N2 when the row address strobe signal RAS has a long duration.

On the other hand, at the initial state, the voltage VXG may be applied to the gate of the bootstrap transistor MN4 under the condition that the signal at the node N2 and the output signal pxi from the high level voltage transfer decoder have the ground voltage level Vss. As a result, the signal at the bootstrap node N3 has the ground voltage level Vss. In this case, when the signal at the node N2 is changed from the ground voltage level Vss to the supply voltage level Vcc, the signal at the bootstrap node N3 is changed from the ground voltage level Vss to the voltage level of VXG−Vtn (the threshold voltage of the NMOS transistor MN4). At this time, if the gate voltage to the bootstrap transistor MN4 is changed from the voltage level VXG to the ground voltage level Vss and the output signal pxi from the high level voltage transfer decoder is changed from the ground voltage level Vss to the high voltage level Vpp, the high level voltage Vpp is transferred to the corresponding word line WL through the high level voltage transfer transistor MN5. In this second embodiment, the high level voltage transfer transistor MN5 needs not have a threshold voltage lower than that of the general NMOS transistor. Also, the second embodiment can solve the word line floating problem resulting from the OFF current flowing from the bootstrap node N3 to the node N2 when the row address strobe signal RAS has a long duration. Further, the second embodiment can enhance the bootstrapping efficiency.

Alternatively, at the initial state, the high level voltage Vpp may be applied to the gate of the bootstrap transistor MN4 under the condition that the signal at the node N2 and the output signal pxi from the high level voltage transfer decoder have the ground voltage level Vss. As a result, the signal at the bootstrap node N3 has the ground voltage level Vss. In this case, when the signal at the node N2 is changed from the ground voltage level Vss to the high voltage level Vpp, the signal at the bootstrap node N3 is changed from the ground voltage level Vss to the voltage level of Vpp−Vtn (the threshold voltage of the NMOS transistor MN4). At this time, if the gate voltage to the bootstrap transistor MN4 is changed from the high voltage level Vpp to the ground voltage level Vss and the output signal pxi from the high level voltage transfer decoder is changed from the ground voltage level Vss to the high voltage level Vpp, the high level voltage Vpp is transferred to the corresponding word line WL through the high level voltage transfer transistor MN5.

As a result, the second embodiment of the present invention is to drop the gate voltage to the bootstrap transistor MN4 from a specific voltage level to the lower voltage level or the ground voltage level Vss before the output signal pxi from the high level voltage transfer decoder is changed from the ground voltage level Vss to the high voltage level Vpp.

Figure 5:
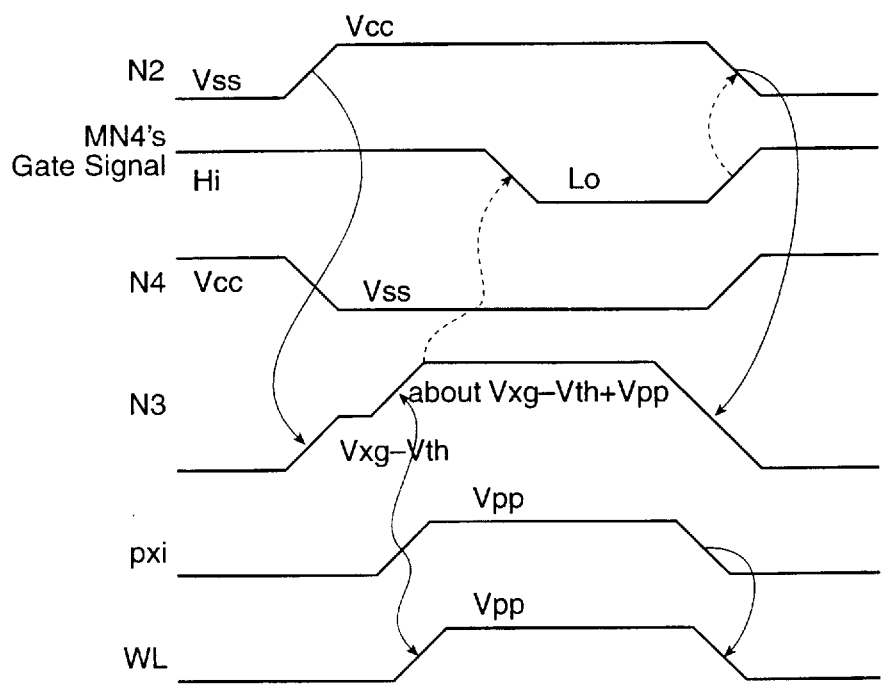
FIG. 5 is a timing diagram illustrating a method for driving word lines in a semiconductor memory device in accordance with a third embodiment of the present invention.

FIG. 5 is a timing diagram illustrating a method for driving word lines in a semiconductor memory device in accordance with a third embodiment of the present invention. The word line driving method in accordance with the third embodiment of the present invention will hereinafter be described in detail with reference to FIGS. 2 and 5.

At the initial state, the high level voltage Vpp the supply voltage Vcc or the voltage VXG is applied to the gate of the bootstrap transistor MN4 under the condition that the signal at the node N2 and the output signal pxi from the high level voltage transfer decoder have the ground voltage level Vss. As a result, the signal at the bootstrap node N3 has the ground voltage level Vss. Then, after the output signal pxi from the high level voltage transfer decoder is changed from the ground voltage level Vss to the high voltage level Vpp, the gate voltage to the bootstrap transistor MN4 is changed from the high voltage level Vpp, the supply voltage level Vcc or the voltage level VXG to the lower voltage level. As a result, the high level voltage Vpp is transferred to the corresponding word line WL through the high level voltage transfer transistor MN5.

Figure 6A:
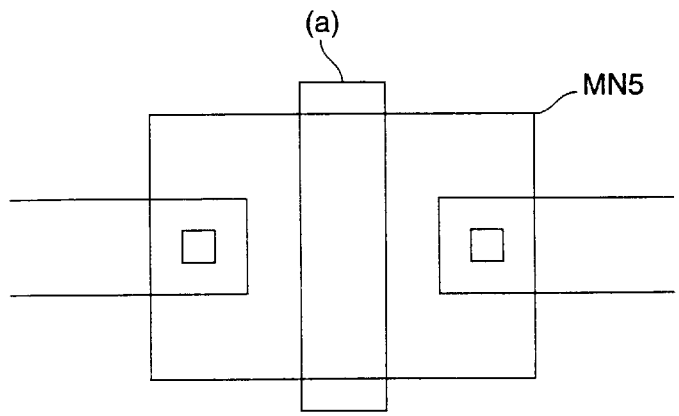
FIGS. 6A and 6B are circuit diagrams illustrating different embodiments of a high level voltage transfer transistor in FIG. 2.
Figure 6B:
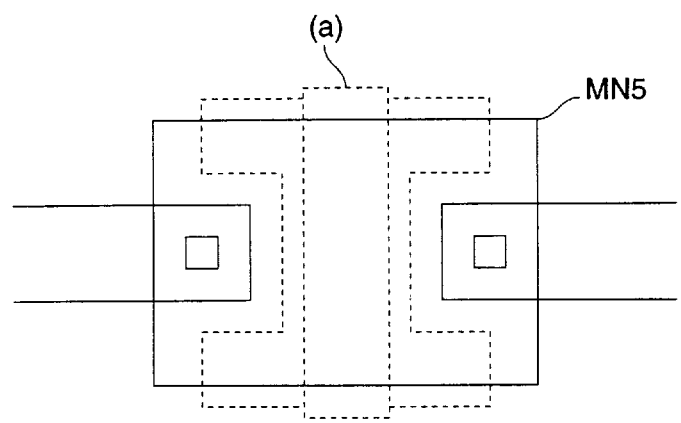

FIGS. 6A and 6B are circuit diagrams illustrating different embodiments of the high level voltage transfer transistor MN5 in FIG. 2. FIG. 6A shows the layout of a general NMOS transistor used as the high level voltage transfer transistor MN5. In FIG. 6B, the high level voltage transfer transistor MN5 has an increased channel length at a poly region a of the bootstrap node N3 to increase the bootstrapping efficiency.

Generally, the transistor channel length as shown in FIG. 6A is used to increase the speed of a driver. However, the transistor channel length as shown in FIG. 6A may be used to increase a gate overlap capacitance to enhance the bootstrapping efficiency.

As is apparent from the above description, according to the present invention, the word line driving method can prevent the selected word line from floating due to OFF current resulting from a low level voltage at the bootstrap node when the row address strobe signal has a long duration. Further, the word line driving method of the present invention has the effect of enhancing the bootstrapping efficiency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for driving word lines in a semiconductor memory device, comprising the steps of:
    (a) allowing a main row decoder to generate a word line enable signal in response to a row address part of address signal bits;
    (b) allowing a high level voltage transfer decoder to generate a word line boosting signal in response to a boost signal part of the address signal bits;
    (c) allowing bootstrap means to transfer the word line enable signal from said main row decoder to a bootstrap node in response to a specific voltage;
    (d) allowing high level voltage transfer means to transfer the word line boosting signal from said high level voltage transfer decoder to a corresponding word line in response to a voltage at said bootstrap node;
    (e) changing the word line boosting signal from a ground voltage level to a high voltage level after the word line enable signal from said main row decoder makes a low to high transition in level, to drive the corresponding word line; and
    (f) changing the specific voltage from the present level to the lower level after performing said step (e).

2. A method for driving word lines in a semiconductor memory device, as set forth in claim 1, wherein the specific voltage has a supply voltage level or a voltage level higher than the supply voltage level and lower than the supply voltage level plus a threshold voltage level of said bootstrap means at the initial state.

3. A method for driving word lines in a semiconductor memory device, as set forth in claim 1, wherein said high level voltage transfer means has a layout for increasing a gate overlap capacitance.

4. A method for driving word lines in a semiconductor memory device, comprising the steps of:
   (a) allowing a main row decoder to generate a word line enable signal in response to a row address part of address signal bits;
   (b) allowing a high level voltage transfer decoder to generate a word line boosting signal in response to a boost signal part of the address signal bits;
   (c) allowing bootstrap means to transfer the word line enable signal from said main row decoder to a bootstrap node in response to a specific voltage;
   (d) allowing high level voltage transfer means to transfer the word line boosting signal from said high level voltage transfer decoder to a corresponding one of the word lines in response to a voltage at said bootstrap node;
   (e) raising the voltage at said bootstrap node to a desired level after the word line enable signal from said main row decoder makes a low to high transition in level and then allowing the specific voltage to make a high to low transition from a high voltage level to a low voltage level, the low voltage level being below the supply voltage; and
   (f) changing the word line boosting signal from a ground voltage level to a high voltage level after the specific voltage makes the high to low transition in level, to drive the corresponding word line.

5. A method for driving word lines in a semiconductor memory device, as set forth in claim 4, wherein the specific voltage has a supply voltage level or a voltage level higher than the supply voltage level and lower than the supply voltage level plus a threshold voltage level of said bootstrap means at the initial state.

6. A method for driving word lines in a semiconductor memory device, as set forth in claim 4, wherein said high level voltage transfer means has a layout for increasing a gate overlap capacitance.

7. A method for driving word lines in a semiconductor memory device, comprising the steps of:
   (a) allowing a main row decoder to generate a word line enable signal in response to a row address part of address signal bits;
   (b) allowing a high level voltage transfer decoder to generate a word line boosting signal in response to a boost signal part of the address signal bits;
   (c) allowing bootstrap means to transfer the word line enable signal from said main row decoder to a bootstrap node in response to a specific voltage;
   (d) allowing high level voltage transfer means to transfer the word line boosting signal from said high level voltage transfer decoder to a corresponding one of the word lines in response to a voltage at said bootstrap node;
   (e) raising the voltage at said bootstrap node to a desired level when the word line enable signal from said main row decoder is changed from a ground voltage level to a supply voltage level and then allowing the specific voltage to make a high to low transition from a high voltage level to a low voltage level, the low voltage level being below the supply voltage; and
   (f) changing the word line boosting signal from the ground voltage level to a high voltage level when the voltage at said bootstrap node is raised to the desired level, to drive the corresponding word line.

8. A method for driving word lines in a semiconductor memory device, as set forth in claim 7, wherein the specific voltage has the supply voltage level or a voltage level higher than the supply voltage level and lower than the supply voltage level plus a threshold voltage level of said bootstrap means at the initial state.

9. A method for driving word lines in a semiconductor memory device, as set forth in claim 7, wherein said high level voltage transfer means has a layout for increasing a gate overlap capacitance.

10. A method for driving word lines in a semiconductor memory device, comprising the steps of:
    (a) allowing a row decoder to generate a word line enable signal in response to an address signal;
    (b) allowing a high level voltage transfer decoder to generate a word line boosting signal in response to the address signal;
    (c) allowing a bootstrap circuit to transfer the word line enable signal from said row decoder to a bootstrap node in response to a specific voltage;
    (d) allowing voltage transfer FET with a lowered threshold voltage to transfer the word line boosting signal from said voltage transfer decoder to a corresponding one of the word lines in response to a voltage at said bootstrap node;
    (e) raising the voltage at said bootstrap node to a desired level when the word line enable signal from said row decoder makes a low to high transition in level; and
    (f) changing the word line boosting signal from a ground voltage level to a high voltage level when the specific voltage makes the high to low transition in level, to drive the corresponding word line.

11. A method for driving word lines in a semiconductor memory device, comprising the steps of:
    (a) allowing a row decoder to generate a word line enable signal in response to an address signal;
    (b) allowing a voltage transfer decoder to generate a word line boosting signal in response to the address signal;
    (c) allowing a bootstrap circuit to transfer the word line enable signal from said row decoder to a bootstrap node in response to a specific voltage;
    (d) allowing a depletion mode FET to transfer the word line boosting signal from said high level voltage transfer decoder to a corresponding one of the word lines in response to a voltage at said bootstrap node;
    (e) raising the voltage at said bootstrap node to a desired level after the word line enable signal from said row decoder makes a low to high transition in level; and
    (f) changing the word line boosting signal from a ground voltage level to a high voltage level after the specific voltage makes the high to low transition in level, to drive the corresponding word line.

12. An apparatus for boosting a word line in a semiconductor device, the apparatus comprising:
    a bootstrap circuit capable of generating a high level voltage; and
    a voltage transfer transistor having a first terminal, a second terminal and a gate, the first terminal of the voltage transfer transistor being electrically coupled to the bootstrap circuit, the second terminal of the voltage transfer transistor being electrically coupled to the word line, and the gate being coupled to a bootstrap node, the voltage transfer transistor being capable of transferring the high level voltage from the bootstrap circuit to the wordline, wherein the voltage transfer transistor has a layout for increasing a gate overlap capacitance between the first terminal and the bootstrap node.

13. An apparatus for boosting a word line in a semiconductor device, the apparatus comprising:

a bootstrap circuit capable of generating a high level voltage; and a voltage transfer transistor having a first terminal, a second terminal and a gate, the first terminal of the voltage transfer transistor being electrically coupled to the bootstrap circuit, the second terminal of the voltage transfer transistor being electrically coupled to the word line, and the gate being coupled to a bootstrap node, the voltage transfer transistor being capable of transferring the high level voltage from the bootstrap circuit to the wordline, wherein the voltage transfer transistor has a threshold voltage lower than a general NMOS transistor threshold voltage.

14. An apparatus for boosting a word line in a semiconductor device, the apparatus comprising:

a bootstrap circuit capable of generating a high level voltage; and a voltage transfer transistor having a first terminal, a second terminal and a gate, the first terminal of the voltage transfer transistor being electrically coupled to the bootstrap circuit, the second terminal of the voltage transfer transistor being electrically coupled to the word line, and the gate being coupled to a bootstrap node, the voltage transfer transistor being capable of transferring the high level voltage from the bootstrap circuit to the wordline, wherein the voltage transfer transistor is a depletion mode NMOS transistor.

15. An apparatus for boosting a word line in a semiconductor device, the apparatus comprising:

a bootstrap circuit capable of generating a high level voltage; and a voltage transfer transistor having a first terminal, a second terminal and a gate, the first terminal of the voltage transfer transistor being electrically coupled to the bootstrap circuit, the second terminal of the voltage transfer transistor being electrically coupled to the word line, and the gate being coupled to a bootstrap node;

a row decoder generating a word line enable signal; and a bootstrap transistor having a fist bootstrap terminal, a second bootstrap terminal, and a bootstrap gate, the first bootstrap terminal being electrically coupled to the row decoder to receive the word line enable signal, the second bootstrap terminal being electrically coupled to the bootstrap node, and the bootstrap gate being coupled to a gate supply voltage source, wherein the bootstrap transistor has a threshold voltage lower than a general NMOS transistor threshold voltage.

16. A method for driving word lines in a semiconductor memory device, comprising the steps of:

(a) allowing a main row decoder to generate a word line enable signal in response to a row address part of address signal bits;

(b) allowing a high level voltage transfer decoder to generate a word line boosting signal in response to a boost signal part of the address signal bits;

(c) allowing bootstrap means to transfer the word line enable signal from said main row decoder to a bootstrap node in response to a specific voltage, the specific voltage having a supply voltage level or a voltage level higher than the supply voltage level and lower than the supply voltage level plus a threshold voltage level of said bootstrap means at the initial state;

(d) allowing high level voltage transfer means to transfer the word line boosting signal from said high level voltage transfer decoder to a corresponding one of the word lines in response to a voltage at said bootstrap node;

(e) raising the voltage at said bootstrap node to a desired level after the word line enable signal from said main row decoder makes a low to high transition in level and then allowing the specific voltage to make a high to low transition in level; and (f) changing the word line boosting signal from a ground voltage level to a high voltage level after the specific voltage makes the high to low transition in level, to drive the corresponding word line.

17. A method for driving word lines in a semiconductor memory device, comprising the steps of:

(a) allowing a main row decoder to generate a word line enable signal in response to a row address part of address signal bits;

(b) allowing a high level voltage transfer decoder to generate a word line boosting signal in response to a boost signal part of the address signal bits;

(c) allowing bootstrap means to transfer the word line enable signal from said main row decoder to a bootstrap node in response to a specific voltage;

(d) allowing high level voltage transfer means to transfer the word line boosting signal from said high level voltage transfer decoder to a corresponding one of the word lines in response to a voltage at said bootstrap node, wherein said high level voltage transfer means has a layout for increasing a gate overlap capacitance;

(e) raising the voltage at said bootstrap node to a desired level after the word line enable signal from said main row decoder makes a low to high transition in level and then allowing the specific voltage to make a high to low transition in level; and (f) changing the word line boosting signal from a ground voltage level to a high voltage level after the specific voltage makes the high to low transition in level, to drive the corresponding word line.

18. A method for driving word lines in a semiconductor memory device, comprising the steps of:

(a) allowing a main row decoder to generate a word line enable signal in response to a row address part of address signal bits;

(b) allowing a high level voltage transfer decoder to generate a word line boosting signal in response to a boost signal part of the address signal bits;

(c) allowing bootstrap means to transfer the word line enable signal from said main row decoder to a bootstrap node in response to a specific voltage, wherein the specific voltage has a supply voltage level or a voltage level higher than the supply voltage level and lower than the supply voltage level plus a threshold voltage level of said bootstrap means at the initial state;

(d) allowing high level voltage transfer means to transfer the word line boosting signal from said high level voltage transfer decoder to a corresponding one of the word lines in response to a voltage at said bootstrap node;

(e) raising the voltage at said bootstrap node to a desired level when the word line enable signal from said main row decoder is changed from a ground voltage level to the supply voltage level and then allowing the specific voltage to make a high to low transition in level; and (f) changing the word line boosting signal from the ground voltage level to a high voltage level when the voltage at said bootstrap node is raised to the desired level, to drive the corresponding word line.

19. A method for driving word lines in a semiconductor memory device, comprising the steps of:

(a) allowing a main row decoder to generate a word line enable signal in response to a row address part of address signal bits;

(b) allowing a high level voltage transfer decoder to generate a word line boosting signal in response to a boost signal part of the address signal bits;

(c) allowing bootstrap means to transfer the word line enable signal from said main row decoder to a bootstrap node in response to a specific voltage;

(d) allowing high level voltage transfer means to transfer the word line boosting signal from said high level voltage transfer decoder to a corresponding one of the word lines in response to a voltage at said bootstrap node, wherein said high level voltage transfer means has a layout for increasing a gate overlap capacitance;

(e) raising the voltage at said bootstrap node to a desired level when the word line enable signal from said main row decoder is changed from a ground voltage level to a supply voltage level and then allowing the specific voltage to make a high to low transition in level; and (f) changing the word line boosting signal from the ground voltage level to a high voltage level when the voltage at said bootstrap node is raised to the desired level, to drive the corresponding word line.

* * * * *